United States Patent [19]
Braun

[11] 3,825,777
[45] July 23, 1974

[54] HALL CELL WITH OFFSET VOLTAGE CONTROL

[75] Inventor: Roland J. Braun, Vestal, N.Y.

[73] Assignee: International Business Machines Corporation, Armonk, N.Y.

[22] Filed: Feb. 14, 1973

[21] Appl. No.: 332,475

[52] U.S. Cl.......... 307/309, 317/234 N, 317/235 H, 330/6, 338/32 H
[51] Int. Cl........................................... H01l 19/00
[58] Field of Search............... 317/235 H; 338/32 H; 307/309

[56] References Cited

UNITED STATES PATENTS

| | | | |
|---|---|---|---|
| 2,945,993 | 7/1960 | Kuhrt | 317/235 H |
| 3,035,183 | 5/1962 | Siebertz et al. | 317/235 H |
| 3,197,651 | 7/1965 | Arlt | 307/309 |
| 3,304,530 | 2/1967 | Honig | 317/235 H |
| 3,370,185 | 2/1968 | Lindberg | 317/235 H |
| 3,419,737 | 12/1968 | Toda | 317/235 H |
| 3,440,454 | 4/1969 | Yanai | 317/235 H |
| 3,522,494 | 8/1970 | Bosch | 317/235 H |
| 3,524,998 | 8/1970 | Gilbert | 317/235 D |
| 3,596,114 | 7/1971 | Maupin et al. | 317/235 H |
| 3,622,898 | 11/1971 | Salmon | 307/303 |
| 3,634,780 | 1/1972 | Bosch et al. | 317/235 H |
| 3,789,311 | 1/1974 | Masuda | 307/309 |

*Primary Examiner*—Stanley D. Miller, Jr.
*Assistant Examiner*—William D. Larkins
*Attorney, Agent, or Firm*—Norman R. Bardales

[57] ABSTRACT

Offset voltage control means are provided for a semiconductor type Hall cell. The control means includes one or more auxiliary electrodes disposed at preselected spatial positions of the cell between the latter's current and sense electrodes. The auxiliary electrode(s) when connected to a predetermined electrical supply provide an auxiliary electrical field which controls the offset voltage at the sense electrodes.

7 Claims, 5 Drawing Figures

HALL CELL WITH OFFSET VOLTAGE CONTROL

BACKGROUND OF THE INVENTION

1. Field of the Invention

This invention relates to semiconductor Hall cell devices and more particularly to offset voltage control means for such devices.

2. Description of the Prior Art

As is well-known to those skilled in the art, a Hall effect device generally comprises a body of Hall material. A transverse electric field is created in the body by the passage of current through the body between two spaced electrodes across which is connected an appropriate electrical supply. The two electrodes are referred to synonymously in the art, and as used herein, as the input, main, control and/or current electrodes. A second pair of spaced electrodes, which are located intermediate of the current electrodes and referred to synonymously in the art, and as used herein, as the output, sense, sensor, sensing, probe, or Hall electrodes, are also provided on the body. In the semiconductor Hall cell types, the body is in addition a semiconductor material of a given conductivity type and the electrodes are generally co-planar.

In operation, the body is inserted in a magnetic field which is or has a component normal to the plane formed by the intersection of the current passing through the body and the resultant transverse electrical field it produces. Under these conditions, a Hall voltage results between the sense electrodes. This Hall voltage is proportional to the main current and magnetic field strength. The voltage across the sense electrodes will be at a null whenever either or both the magnetic field is absent or the main current is absent. Ideally, if the two sense electrodes are spatially located on an equipotential line or points of the electric field, the null voltage will be zero. However, in practice because of factors due to magnetic remanescence, manufacturing tolerances and the like and/or as well as external conditions such as changes in environmental parameters as temperature and the like, the null is generally at some other finite level. The null voltage is referred to as an offset voltage.

In one prior art device offset voltage control is provided by an auxiliary magnetic field. More particularly, a semiconducting Hall cell has a pair of spaced elongated main electrodes and a pair of spaced point contact sense electrodes located between the main electrodes. The Hall cell is positioned in the gap of the core structure of an electromagnet. When the electromagnet is energized, it provides the main magnetic field used in the operation of the device. The auxiliary magnetic field is provided by a compensating permanent magnet which is adjustably mounted to the core structure of the electromagnet. The permanent magnet is manually oriented so as to mitigate or eliminate the residual, i.e. null, component. Among the disadvantages of this particular prior art device is that the device is not readily compact due to the presence of the compensatory magnet which is appended outwardly from the main magnetic field core structure. Moreover, the strength of the auxiliary magnetic field provided by the permanent magnet is constant, i.e. not adjustable per se, and, hence, provides a limited range of compensation. Furthermore, the prior art device is not conducive to being implemented as an automatically compensated system. To do so would require mechanical linkage mechanisms and the like for positioning the permanent magnet to the desired location thereby increasing its complexity, reliability and/or overall volume.

Another way of providing offset voltage control in the prior art is to provide a balancing circuit, i.e. a resistive voltage divider, to one of the sense electrodes to compensate for any inherent voltage differences between the two sense electrodes. For similar reasons, still other ways of providing offset voltage control in the prior art are the use of a resistor, or the use of a series connected resistor and diode rectifier, connected between one of the sense electrodes and one of the current electrodes. These prior art arrangements, however, reduce the sensitivity of the sense electrodes and/or provide a limited range of compensation.

In still another prior art device, one of a pair of elongated current electrodes is sub-divided into two symmetrical co-linearly aligned parts. The two parts are interconnected by a potentiometer, the slide wire of which is positioned to adjust the main current distribution between the sub-divided current electrode and the non-divided other current electrode. In this way the offset voltage is compensated. However, this arrangement has certain disadvantages. One of these is that the compensation provided is limited to only a small effective range of change in the main current electric field distribution. It also requires that the main electric field become distorted, i.e., non-uniform, and thereby reduce the effectiveness of the Hall cell device as compared to a device having a substantively uniform field distribution for the same equivalent length of current electrode.

Still in another prior art device, a certain Hall cell is provided with three pairs of pointcontact type spaced sense electrodes. The six sense electrodes are disposed on the cell in two spaced groups of three electrodes each. Each pair of sense electrodes has one of its electrodes in one group and its other electrode in the other group. The electrodes of each group are arranged in close spatial proximity with respect to each other. The prior art device contemplates utilizing one electrode from each group on the basis of selecting the sense electrode pair which provides the optimum minimum offset voltage, i.e. null. As such, there is no control per se. However, it alternatively contemplates interconnecting two sense electrodes of the same particular group with a bridging resistor and adjusting the slidewire thereof to provide control of the offset voltage. However, this arrangement provides certain disadvantages. For example, it provides a limited range of compensation and/or it impairs the sensitivity of the Hall device.

It should be understood that in the prior art it is known to subdivide, i.e. split, the main or sense electrodes of certain Hall effect devices for other reasons. In these cases, however, the subdivided co-linear electrodes are providing the same general function as their integral counterpart and in no way are providing the function of offset voltage control. For example, in one prior art device the current and/or sense electrodes are uniformly sub-divided and individual conductors of an anisotropic multi-lead conductor cable or bundle connected to each sub-electrode. The anisotropic properties of the conductors prevent short circuiting between adjacent sub-electrodes and thereby increase the efficiency of the device. In still other prior art devices, the Hall and sense electrodes are sub-divided and the co-linear sub-divided electrodes are connected to mutually-exclusive ones of plural capacitors to reduce insertion losses.

SUMMARY OF THE INVENTION

It is an object of this invention to provide offset voltage control for a semiconductor type Hall cell.

Another object of this invention is to provide a compact Hall cell and offset voltage control means therefor.

It is another object of this invention to provide the aforesaid control which mitigates adverse effects to the Hall cell sensitivity.

It is still another object of this invention to provide the aforesaid offset voltage control by an auxiliary electrical field.

Another object of this invention is to provide the aforesaid offset voltage control by an adjustable auxiliary electrical field.

Still another object of this invention is to provide the aforesaid control to include external control circuitry, the components of which are fabricated with the Hall cell in a monolithic structure.

It is still another object of this invention to provide the offset voltage control for a semiconductor type Hall cell which exclusively interacts with the cell's main electrode circuitry.

Still another object of this invention is to provide offset voltage control for a semiconductor type Hall cell which is associated with a switching or analog type amplifier.

Still another object of this invention is to provide offset voltage control for a semiconductor type Hall cell that continuously, i.e. automatically, compensates for initial offset voltage, temperature drift, and stationary or slowly changing magnetic fields.

According to one aspect of the invention, there is provided Hall effect apparatus which has a planar semiconductor body of Hall effect material having a region of single conductivity type. At least two spaced non-colinear elongated current electrode means are disposed on the body in contact with the region. In addition, at least two spaced sense electrode means are disposed on the body between the two current electrode means in contact with the region. At least one auxiliary electrode means is adapted to be connected to a predetermined electrical supply circuit means. The auxiliary electrode means is disposed on the body in contact with the region between a predetermined one of the two current electrode means and an imaginary line connecting the two spaced sense electrode means. The electrical supply circuit means when connected to the auxiliary electrode means produces an auxiliary electrical field distribution in the body for controlling the offset voltage across the two sense electrode means.

BRIEF DESCRIPTION OF THE DRAWING

In the figures, like elements are designated with similar reference numerals.

DESCRIPTION OF THE PREFERRED EMBODIMENTS

Figure 1:
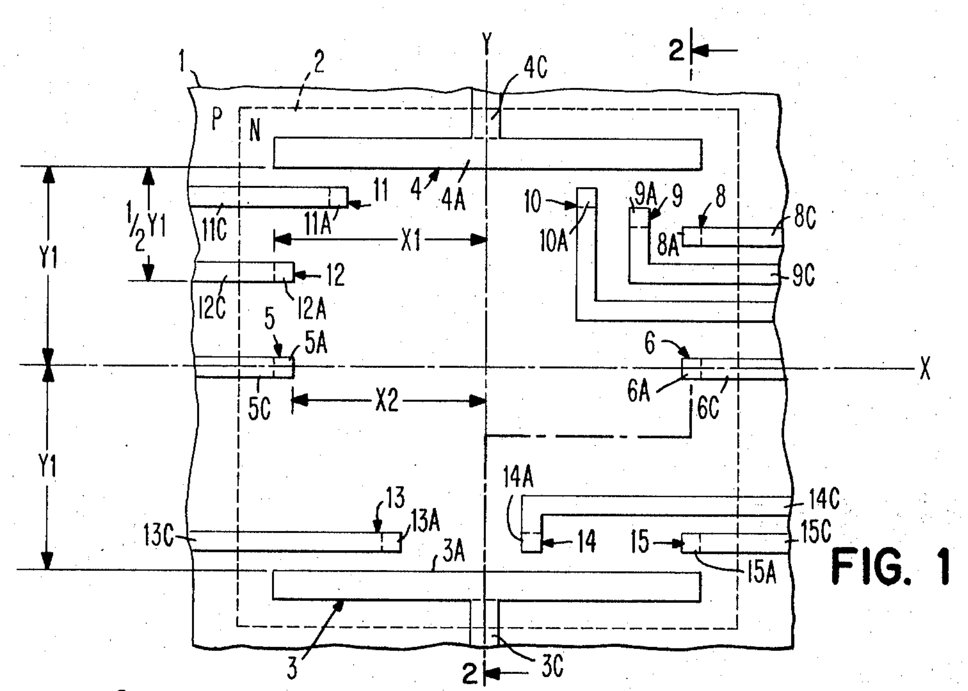
FIG. 1 is an enlarged top view of an embodiment of the Hall effect apparatus of the present invention.
Figure 2:
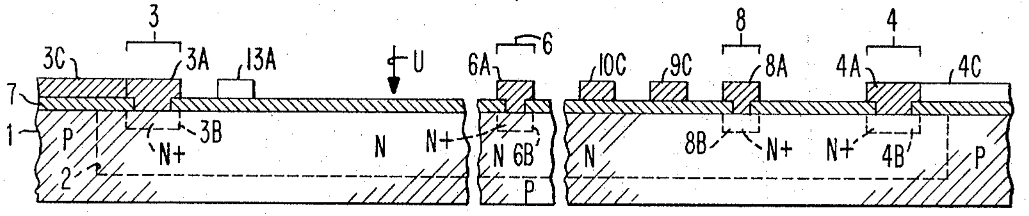
FIG. 2 is a cross-sectional view of the apparatus of FIG. 1 taken along the line 1—1 thereof.

Referring to FIGS. 1 and 2, there is shown a preferred embodiment of the semiconductor type Hall effect apparatus of the present invention. Body 1 is a planar semiconductor substrate of a given conductivity type, e.g. P type. The semiconductor body 1 is a Hall effect material such as silicon, for example. Body 1 has a region 2 of single and preferably opposite conductivity type, e.g. N type.

Two spaced non-colinear elongated current electrode means designated generally by the reference characters 3, 4 are disposed on the body 1. Two spaced sense electrode means designated generally by the reference characters 5, 6 are also disposed on body 1 and are located between the two electrode means 3, 4. Each of the electrode means 3 – 6 is in contacting relationship with the region 2. More specifically, each of the electrode means 3 – 6 has a printed circuit conductor which is in the contacting relationship with the region 2. The connection to region 2 may be made directly or as is preferred may be made through a diffused resistance sub-region formed in and of the same conductivity type as region 2. In the preferred last described case, both the printed conductor and its associated diffused resistive sub-region are constituent elements of the particular electrode means with which they are associated.

Thus, in the embodiment of FIG. 1 the elongated current electrode means 3, 4 are comprised of respective printed conductor portions 3A, 4A and diffused N+ conductivity type sub-regions 3B, 4B, cf. FIG. 2, which are formed in region 2. Each of the planar areas of sub-regions 3B, 4B is co-extensive with the respective planar area of the particular one of the printed conductor portions 3A, 4A under which it lies. The printed conductor portions 3A, 4A are provided with integral extensions 3C, 4C, partially shown, that provide lead in connections to the electrode means 3 and 4, respectively. The extensions 3C, 4C are electrically insulated from the body 1 by a suitable insulating layer 7 such as an oxide layer in a manner well known to those skilled in the art.

The sense electrode means 5, 6 are provided in a similar manner. Each of the means 5, 6 has a printed circuit conductor portion 5A, 6A which is in contact with the region 2. The contact area of a sense electrode means 5, 6 is substantially smaller than the contact area of one of the current electrode means 3, 4. Typical vertical by horizontal dimensions, as viewed in FIG. 1, and resultant contact area of a sense electrode means are 0.20 mils × 0.30 mils or 0.06 square mils of contact area; whereas, the corresponding vertical and horizontal dimensions and resultant contact area of a current electrode means are 0.40 mils × 12.65 mils or 5.06 square mils of contact area. In accordance with the preferred embodiment implementation, each sense electrode means also has a diffused resistance sub-region, e.g. resistance sub-region 6B shown in FIG. 2, formed in and of the same conductivity type as region 2. The diffused resistance sub-region of each sense electrode means 5, 6 has a planar area co-extensive with the planar area of the printed circuit portion, e.g. portion 6A shown in FIG. 2, of the particular sense electrode means. The printed circuit portions 5A, 6A of the sense electrode means also have extensions 5C, 6C, partially shown, that provide lead in connections to the electrode means 5 and 6, respectively, and which extensions 5C, 6C are insulated from the body 1 by layer 7.

Preferably, the electrode means 3 to 6 are disposed in a symmetrical manner on the body 1. For purposes of explanation, there is shown an imaginary rectangular coordinate system in FIG. 1 defined by the axes X and Y shown therein. Furthermore, for these same purposes, the electrode means 3 to 6 are assumed to be disposed on the body 1 in a symmetrical manner with respect to this X-Y coordinate system. Thus, each of the current electrode means 3 and 4 has an equal spacing Y1 from the X axis of the coordinate system and are in a substantially parallel relationship with respect to each other. In addition, the left and right vertical short edges, as viewed in FIG. 1, of the current electrode means 3, 4 terminate at an equal distance X1 from the Y axis of the coordinate system. Likewise, for purposes of explanation, it is assumed that the respective centers of the sense electrode means 5, 6 lie on an imaginary line which is co-incident with the X axis and such that each of the vertical edges as shown in FIG. 1 of the means 5, 6 are equally spaced a distance X2 from the Y axis. It is further assumed for purposes of explanation that the sense electrode means 5, 6 are symmetrically and co-linearly aligned with respect to each other. As such, the sense electrode means 5, 6 are equidistant from each of the current electrode means 3, 4.

In normal operation, an appropriate electrical supply circuit, not shown, is connected across the electrode means 3 and 4. An electric current as a result flows between the electrode means 3 and 4 through region 2 and produces a transverse electric field, hereinafter referred to as the main electrical field or simply the main field.

The equipotential lines of this main field under the aforedescribed assumed ideal conditions of symmetry will thus be parallel with the elongated current electrode means 3, 4. Accordingly, the offset voltage present across the sense electrode means 5, 6 is at a zero level. When there is applied a magnetic field with a component normal to the plane of the electric field as indicated by the arrow U in FIG. 2, a Hall voltage appears across the two sense electrode means 5, 6 proportional to the strength of the normal magnetic field component and the current producing the electric field in a manner well known to those skilled in the art.

In practice, the offset voltage across the sense electrode means 5, 6 may be at some finite value other than zero. For example, due to manufacturing tolerances the electrode means 3, 4 may not be symmetrically disposed with respect to the X-Y coordinate system of FIG. 1. Thus, electrode means 3, 4 may be slightly inclined with respect to each other, and/or one of the electrode means 3, 4 may not be centered about the Y axis and may be shifted somewhat to the left or right as the case may be. As such, the sense electrode means 5, 6 may not lie on the same equipotential line and, hence, the offset voltage level is not zero. The sense electrode means 5, 6 in addition or alternatively may also not be symmetrically disposed in the X-Y coordinate system and in fact may be disposed in such a manner that they do not lie on the same equipotential line. Also, the region 2 may have a non-uniform resistance characteristic. Any or all of these factors would cause the offset voltage across the sense electrode means 5, 6 to be at other than a zero level.

In accordance with the principles of my invention, an auxiliary electrical field is utilized to control the offset voltage. The auxiliary electrical field is provided by one or more auxiliary electrode means. Each auxiliary electrode means is disposed between the aforementioned imaginary line on which the sense electrode means 5, 6 lie and one of the elongate current electrode means 3, 4. By way of example, eight such auxiliary current electrode means 8 – 15, are shown in the embodiment of FIG. 1. The auxiliary circuit electrode means 8 – 12 are disposed at different spatial positions between the aforementioned imaginary line and electrode means 4, and the others 13 – 15 are disposed at different spatial positions between the imaginary line and electrode means 3.

Each of the auxiliary electrode means 8 – 15 has a printed circuit conductor portion 8A – 15A which is in contact with region 2 similar to the electrode means 3 – 6. The planar contact area of each of the auxiliary electrode means is substantially smaller than the corresponding area of one of the current electrode means 3, 4 and is comparable to the corresponding area of one of the sense electrode means 5, 6. In accordance with the preferred embodiment implementation, each auxiliary electrode means 8 – 15 also has a diffused resistance region, cf. region 8B of electrode means 8 shown in FIG. 2, formed in and of the same conductivity type as region 2. Each of the planar areas of 15C using diffused resistance regions of the means 8 – 15 are co-extensive with the planar areas of their respective printed circuit portions 8A – 15A. Each of the printed circuit portions 8A – 15A have an extension, i.e. partially shown extensions 8C – 15C, that provide lead in connections to the particular electrode means 8 – 15. The extensions 8C – 15C are insulated from body 1 by layer 7. Alternatively, the diffused resistance regions may be obviated and in such cases the portions 8A – 15A are in direct contact with region 2.

The auxiliary electrical field is produced in region 2 by a control current which is passed through a preselected one or more of the auxiliary electrode means 8 – 15. The control current is derived from an electrical supply, not shown. The electrical supply may be the electrical supply which also provides the main current in region 2 between electrode means 3, 4 and/or it may be an independent supply. The control current is preferably adjustable so as to provide an adjustable offset voltage control. Because of the relative contact area size between a main electrode means and an auxiliary electrode means, the auxiliary field is superimposed on the main field in a very localized manner sufficient to cause a significant change in the offset voltage and yet maintain the uniform main field distribution elsewhere.

Figure 3:
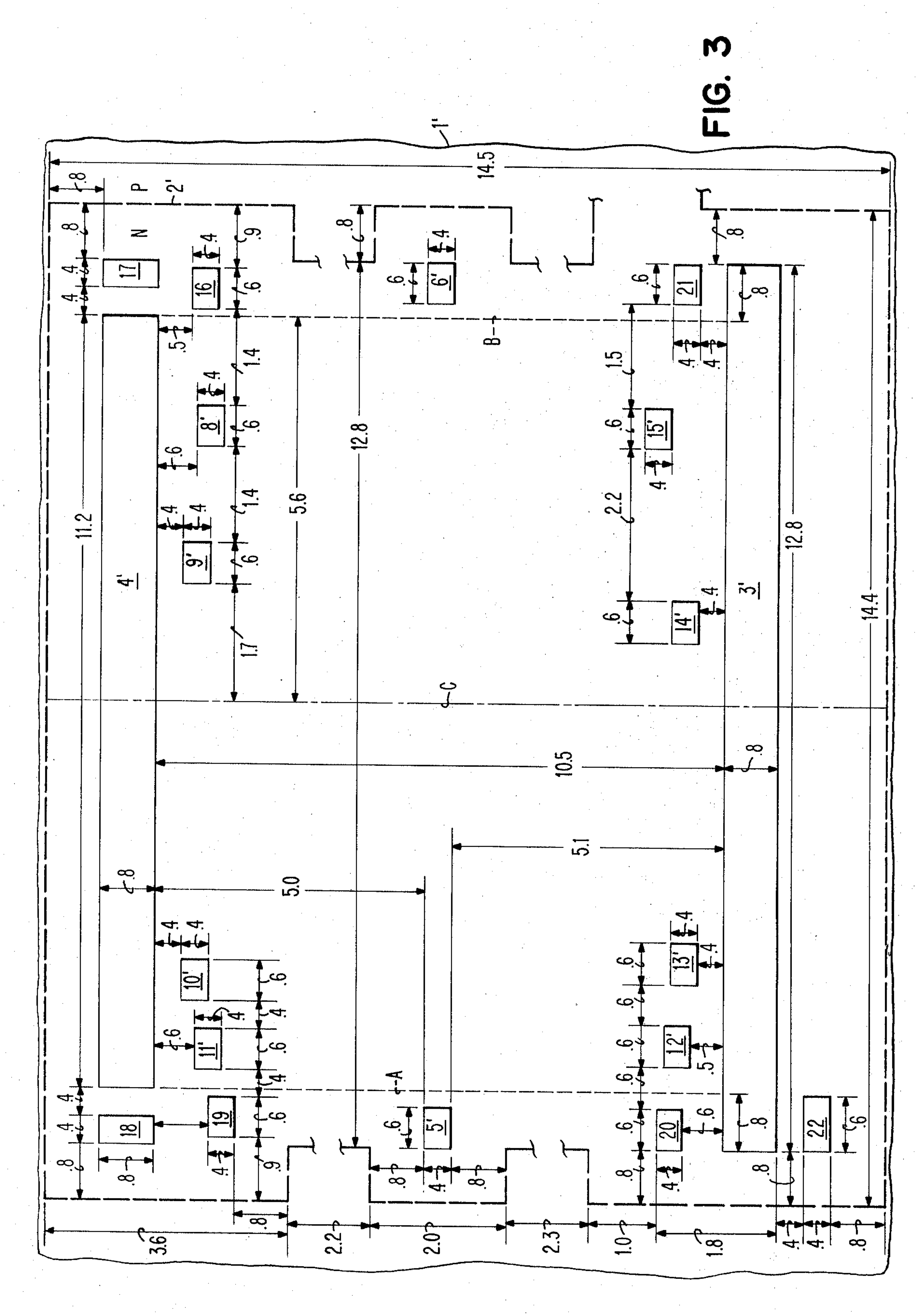
FIG. 3 is an enlarged top view of another embodiment of the Hall effect apparatus of the present invention.

Prior to describing various operational modes of the embodiment of FIG. 1, there will be next described data of another embodiment of the invention which is partially shown in FIG. 3.

Referring to FIG. 3, the semiconductor Hall cell is fabricated from a planar silicon wafer 1' of P type conductivity and having Hall effect properties. A region 2' of opposite conductivity type, to wit: N type, is formed in the wafer 1'. Disposed on the region 2' are two elongated parallel current electrodes 3', 4'. Two sense electrodes 5', 6' are also disposed on region 2'. In accordance with the principles of the present invention, at preselected spatial positions on the region 2', eight auxiliary electrodes 8' – 15' are disposed. More particularly, electrodes 8' – 15' are placed at spatial positions which are located in a rectangular area formed between the two parallel elongated side edges of electrodes 3', 4' which face each other and the two imaginary lines A, B shown in FIG. 3. Lines A, B are coincident with the two parallel short side edges of the shorter current electrode 4'. As such, the electrodes 8' – 15' are located on region 2' in the area where the main electrical field produced by the main current passing through region 2' between electrodes 3', 4' is substantially uniform. As in the embodiment of FIG. 1, electrodes 8' – 11' of FIG. 3 lie between electrode 4' and an imaginary line, not shown, joining the centers of electrodes 5', 6', and electrodes 12' – 15' lie between the last mentioned imaginary line and electrode 3'.

To provide a comparison other electrodes 16 – 22 are provided outside the aforedescribed rectangular area. In particular, electrodes 17 and 18 are disposed in a co-linear relationship with electrode 4' and electrode 22 is spaced outwardly from electrode 3'. Electrodes 16, 19, 20, 21 are located between electrodes 3', 4', but are in addition located outwardly from the respective lines A, B. For sake of clarity, the various size and spacing dimensions associated with the embodiment of FIG. 3 are shown therein.

With the positive terminal of a ten volt d.c. electrical supply, not shown, connected to electrode 4', the negative terminal grounded and connected to electrode 3', the other electrodes 5' to 15' left open circuited and in the absence of a magnetic field, the average differential voltage between electrodes 5' and 6' is +6.25 millivolts, the positive sign resulting from an arbitrarily selected convention in which the voltage at electrode 5' is subtracted from the voltage at electrode 6'.

Under the same set of above conditions but with the specific interconnections of the electrodes 3' – 15' and 16 – 22, as indicated in the first column of Table I below, the corresponding offset voltage changes ΔV between electrodes 5' and 6' from the aforementioned inherent value of 6.25 millivolts and employing the same polarity convention are indicated in the second column of Table I, as follows:

TABLE I

| INTERCONNECTION | ΔV(millivolts) |
|---|---|
| 4' – 8' | +117.84 |
| 4' – 9' | +044.08 |
| 4' – 10' | –076.85 |
| 4' – 11' | –117.17 |
| 3' – 12' | +082.95 |
| 3' – 13' | +063.52 |
| 3' – 15' | –146.90 |
| 4' – 16 | +66.03 |
| 4' – 18' | –12.91 |
| 4' – 19 | –105.91 |
| 4' – 20 | –63.06 |
| 3' – 21 | –45.08 |
| 3' – 22 | 0 |

From the above, it can be readily seen that the offset voltage control across the sense electrodes 5', 6' is made available by interconnecting one of the auxiliary electrodes 8' – 15' to the particular closest one of the main electrodes 3', 4'. Moreover, the amount of control increases as the spacing between the particular auxiliary electrodes 8' – 15' and the particular nearest main electrodes 3', 4' to which it is connected increases and the spacing between the particular auxiliary electrodes 8' – 15' and center line C increases. As can be seen from the data associated with the electrodes 16 – 22 in Table I, the amount of control decreases outside the aforedescribed rectangle formed by the inwardly facing elongated sides of electrodes 3', 4' and the imaginary lines A, B. For example, ΔV is only –12.91 millivolts when the co-linearly aligned electrodes 4' and 18 are connected, and is zero when the outlying electrode 22 is connected to electrode 3'. Preferably, the auxiliary electrodes 8' – 15' are located in the aforedescribed rectangular area. Moreover, it is preferred that electrodes 8' – 15' be located at a distance which is not more than one-half way between the nearest current electrode to which it is to be connected and an imaginary line, not shown in FIG. 3, which connects the centers of the sense electrodes 5', 6'. While auxiliary electrodes may be located more than this half way line, it is generally preferable to locate them in closer proximity to the nearest current electrode so as to minimize undesirable loading effects of the sense electrodes 5', 6'. Thus, as can be readily seen, each of the auxiliary electrodes 8' – 15' when connected to an electrical energy supply provides a means for controlling the offset voltages at electrodes 5', 6'. The amount of control depends upon the particular auxiliary electrode selected. In addition, if the control is adjustable, it provides a wide range of control. For example, if electrode 11' is utilized, the range can vary from 0 millivolts to –117.17 millivolts. Moreover, if the control is adjustable, the ΔV may be preset to any predetermined level of the range including a zero level. Thus, the control can be used, for example, to compensate the inherent offset voltage and set it to a zero level by adjusting it to a –6.25 millivolts, for example.

It should be understood that electrodes 8' – 15' may be interconnected in various combinations between themselves and/or to their nearest main electrode to provide other levels of offset voltages at electrodes 5', 6'. For example, for the set of conditions previously described and which included placing +10 volts across electrodes 3', 3', and with the only other connection being an interconnection between electrodes 14' and 15', the offset voltage change ΔV between electrodes 5', 6' is –26.55 volts.

In a similar manner different operational modes of the embodiment of FIG. 1 may be obtained by interconnecting preselected one or ones of the auxiliary electrode means 8 – 15 between themselves and/or to their particular nearest current electrode means 3, 4, and/or by making the control adjustable to provide different offset control voltages between the sense electrode means 5, 6. A simple way of making the control adjustable, for example, is to interconnect the particular one of the auxiliary electrode means and its nearest current electrode means through an appropriate adjustable resistor.

The Hall apparatus of FIG. 1 is fabricated using well-known integrated circuit techniques. First, a semiconductor planar body 1 of Hall material and of a given conductivity type, e.g. P type, is provided. Body 1 acts as a substrate and a diffusion process using masking techniques is employed to form in the body 1 the region 2 of opposite conductivity type, e.g. N type. This is followed by a subsequent masking and diffusion process to form the N+ resistance sub-regions of the various electrode means contacts. Next, the insulating layer 7 is formed on the upper surface of the body 1 using well known techniques. Next, using masking and etching techniques, openings in the layer 7 are formed to provide access to the N+ regions. This is followed by the formation of the printed circuit conductors 3A – 15A and their extensions 3C – 15Cusing suitable printed circuit masking techniques. If the Hall apparatus is part of a monolithic integrated circuit, the processes associated with the formation of the region 2 and N+ subregions and printed circuit conductors of the Hall apparatus may be concurrently carried out with the processes associated with the formation of active and passive diffused and printed circuit components located elsewhere in the body 1 but omitted in FIG. 1 for sake of clarity.

Figure 4:
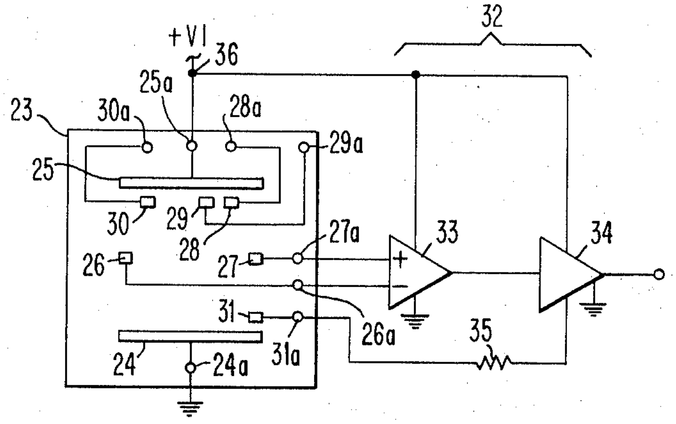
FIG. 4 is a schematic view shown partially in block form of another embodiment of the Hall effect apparatus of the present invention.

Referring now to FIG. 4, there is shown an embodiment of the present invention which comprises in combination a planar semiconductor Hall cell 23 and associated switching circuitry 32. Cell 23 is a monolithic chip of a given conductivity type, e.g. N type, and includes a pair of elongated current electrodes 24, 25 and a pair of intermediate sense electrodes 26, 27. The cell 23 also has four auxiliary electrodes 28 – 31 which when appropriately connected to an electrical supply provide an auxiliary electrical field in accordance with the principles of the present invention. The electrodes 24 – 31 are connected to respective terminals **24*a* – 31*a*, which are located about the periphery of chip 23.**

The inputs of differential amplifier circuitry 33 are connected across the sense electrodes 26, 27 of chip 23. The output of circuitry 33 is connected to the input of a switching amplifier circuit 34. The switching amplifier circuit 34 has positive feedback loop which includes a resistor 35 that is connected to terminal 31a of auxiliary electrode 31.

In operation, terminal 25a is connected to the positive terminal, not shown, of an electrical supply, not shown, that provides a voltage +V1 thereat. The return path is effected through the ground terminal 24a which is connected to the negative terminal, not shown, of the supply. Circuitry 33 and 34 are also connected to the electrical supply, not shown, at node 36.

In operation, the Hall voltage across the sense electrodes 26, 27 is differentially amplified by circuitry 33. The sense electrodes 26, 27 are connected to the input of circuitry 33, such that if the voltage at electrode 27 is greater than the voltage at electrode 26 and their difference is above a certain preselected level, the output of circuitry 33 exceeds the threshold input of switching amplifier circuitry 34 thereby causing the latter to turn ON. Below the preselected level, or if the voltage at electrode 27 is less than the voltage at electrode 26, the output of circuitry 33 maintains the switching amplifier circuitry 34 in an OFF condition or state. When circuitry 33 is turned ON, a feedback loop that includes resistor 35 is activated. As a result, the terminal 31a becomes positive and current flows into auxiliary electrode 31. This in turn causes the voltage at electrode 27 to suddenly increase causing a concomitant increase in the differential voltage between electrodes 26 and 27. As a result, this reinforces the switching action of circuitry 34 and causes its output to be latched. Different preselected differential voltage levels may be obtained by judiciously selecting a particular one of the many possible interconnection patterns associated with the electrodes 28 – 30 between themselves or in combination with main electrode 25, and/or by interchanging the connection of the sense electrodes 26, 27 with the inputs of circuitry 33. Once the differential voltage level is selected, the change in the differential voltage between the electrodes 26, 27 is thereafter caused, for example, by a predetermined change in the magnetic field strength as may be the case where the apparatus is used as a proximity sensor or magnetic switch or actuator.

Figure 5:
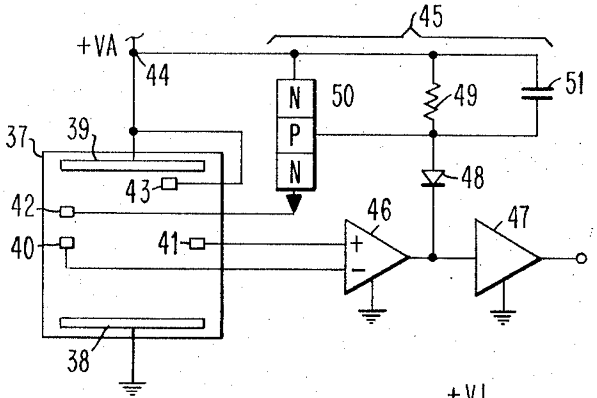
FIG. 5 is a schematic view shown partially in block form of still another embodiment of the Hall effect apparatus of the present invention.

In the apparatus of the embodiment of FIG. 5, relatively slow changes in the offset voltage of the semiconductor Hall cell 37 are compensated for automatically in accordance with the principles of the present invention. More specifically, a planar semiconductor Hall cell 37 of a given conductivity type, e.g. N type, and has a pair of intermediate sense electrodes 40, 41. The cell 37 includes an auxiliary electrode 42 which is used in the compensation of the Hall offset voltage. Another auxiliary electrode 43 is provided and may be used, if desired, to provide another offset voltage level when connected to an appropriate electrical supply than would be the case if it were not used. By way of example, as shown in FIG. 5, the auxiliary electrode 43 is used, it being connected to the electrical supply, not shown, which supply is connected across the main electrodes 38, 39 and provides a positive d.c. voltage level VA at node 44.

The apparatus of FIG. 5, in addition has circuitry 45 that includes differential amplifier 46 and switching amplifier 47. The sense electrodes 40, 41 of cell 37 are connected across the inputs of differential amplifier 46. The output of the differential amplifier 46 is connected to the input of amplifier 47 and a negative feedback loop 48 – 51 which controls the current passing through auxiliary electrode 42.

In operation, under normal quiescent conditions switching circuit 47 is in its OFF state. Under these conditions, the initial offset voltage of cell 37 is at some predetermined level and the output voltage of differential amplifier 46 is below the threshold level of amplifier 47. Furthermore, under these normal quiescent conditions, the diode 48 is conducting a small current which is substantially equal to the current in resistor 49 minus the drive current into the base of transistor 50. Capacitor 51 is charged and the voltage level is equivalent to the IR drop across resistor 49. Transistor 50 is in an ON state and its emitter collector circuit passes a current to the auxiliary electrode 42 from the common power supply, not shown, that is providing the voltage VA at node 44.

For sake of explanation, it is assumed that under normal quiescent conditions cell 37 is also in a magnetic field environment which provides a predetermined magnetic field bias for the cell 37. It is now assumed that the voltage at electrodes 40, 41 begins to charge slowly due to an environmental change, such as, for example, drift in the power supply bias and/or drift in the magnetic field bias, and/or drift in the normal operating temperatures. For the particular manner in which the electrodes 40, 41 are connected to the inputs of amplifier 46, if the change from the initial offset voltage level is in a direction which results from the voltage at electrode 40 becoming more positive relative to the voltage at electrode 41, the output voltage of amplifier 46 decreases. This causes an increased current through diode 48 and a reduction in the base voltage of transistor 50. Consequently, transistor 50 reduces the amount of current being fed to auxiliary electrode 42. This, in turn, causes a reduction of the voltage at the electrodes 40, 41, i.e. provides offset voltage compensation, and returns the voltage thereat to the preselected initial offset voltage.

The opposite effect takes place if the voltage across the electrodes 40 and 41 changes in the opposite direction, i.e. the voltage at electrode 40 becomes more negative with respect to the voltage at electrode 41. The output voltage of amplifier 46 increases, reducing current through diode 48, and thereby increasing the base voltage of transistor 50. An increased current is now fed to auxiliary electrode 40. Again, the voltage across electrodes 40, 41 is returned to the initial offset level. In either case, the slow changing voltage across the electrodes 40, 41 is prevented from becoming of such a magnitude that it could cause the output of amplifier 46 to reach the threshold of The parameters of RC time constant associated with capacitor 51 is selected such that the voltage level at the base of transistor 50 changes relatively slowly. In particular, the time constant RC is such that the rate of change depends mainly on the value of capacitor 51. As a result, only relatively slowly changing voltages across the electrodes 40, 41 are compensated, such as, for example, the changes caused by temperature variations, bias field drifts or supply voltage drift and which are generally called low frequency noise. On the other hand, a relatively fast Hall voltage change of sufficient magnitude and direction causes the output of amplifier 46 to increase to the threshold level of switching amplifier 47 and the output of the latter to switch before the compensation network can fully respond.

The apparatus of FIG. 5 may be utilized, for example, in applications such as magnetic sensors or Hall switch actuators or the like. In these type of applications a Hall voltage is produced at the electrodes 40, 41 in response to a sudden change in the magnetic field strength which results in the triggering of amplifier 47. Thus, the compensation provided in the apparatus of FIG. 5 is ideal for such applications as it compensates for slow deviations of the voltage at electrodes 40, 41 from the initial preselected offset level and thus is prevented from premature triggering of the amplifier 47 from slow frequency noise, yet it responds to the rapid Hall voltage changes which the Hall cell is sensing.

It should be understood that the Hall cell and associated circuitry of the apparatus of FIGS. 4 – 5 may be fabricated as common integrated circuit monolithic structure, or alternatively the Hall cell and the associated circuitry may be fabricated as separate monolithic structures, or as discrete or hybrid component forms.

Moreover, while the apparatus of FIGS. 4 – 5 utilize a bistable, i.e. two state, output amplifier, or as sometimes referred to in the art as a switching amplifier, it should be understood that the apparatus of FIGS. 4 – 5 may be modified to use analog type amplifiers. It should also be understood, that while the circuitry 32 and 45 are preferred, the apparatus of the present invention may be modified to include other types of detector circuitry.

Thus, while the invention has been particularly shown and described with reference to preferred embodiments thereof, it will be understood by those skilled in the art that the foregoing and other changes in form and details may be made therein without departing from the spirit and scope of the invention.

I claim:

1. Hall effect apparatus comprising:

a planar semiconductor body of Hall effect material having a region of single conductivity type, at least two spaced non-colinear elongated current electrode means disposed on said body in contact with said region, at least two spaced sense electrode means disposed on said body between said two current electrode means in contact with said region, predetermined electrical supply circuit means, and at least one auxiliary electrode means connected to said predetermined electrical supply circuit means, said auxiliary electrode means being disposed on said body in contact with said region between a predetermined one of said two current electrode means and an imaginary line connecting said two spaced sense electrode means, said electrical supply circuit means connected to said auxiliary electrode means producing an auxiliary electrical field distribution in said body for controlling the offset voltage across said two sense electrode means.

2. Apparatus according to claim 1 wherein said electrical supply current means is adjustable.

3. Apparatus according to claim 1 wherein each of said electrode means are of the printed circuit conductor type.

4. Apparatus according to claim 1 wherein each of said electrode means comprises a diffused sub-region in said region and a printed circuit conductor in contact with the particular sub-region.

5. Apparatus according to claim 1 further comprising:

means for connecting said current electrode means to said electrical supply circuit means for producing a main electrical field distribution in said body.

6. Apparatus according to claim 1 further comprising:

another electrical supply circuit means, and means for connecting said current electrode means to said another electrical supply circuit means for producing a main electrical field distribution in said body.

7. In Hall effect apparatus of the type having a planar semiconductor body of Hall effect material having a region of single conductivity type, at least two spaced non-colinear elongated current electrode means disposed on said body in contact with said region, and at least two spaced sense electrode means disposed on said body between said two current electrode means in contact with said region, the improvement comprising:

at least one auxiliary electrode means connected to a predetermined electrical supply circuit means, said auxiliary electrode means being disposed on said body in contact with said region between a predetermined one of said two current electrode means and an imaginary line connecting said two spaced sense electrode means, said electrical supply circuit means connected to said auxiliary electrode means producing an auxiliary electrical field distribution in said body for controlling the offset voltage across said two sense electrode means.

* * * * *